(12) United States Patent
Laine et al.

(10) Patent No.: US 10,211,058 B2
(45) Date of Patent: Feb. 19, 2019

(54) ESD PROTECTION DEVICE

(71) Applicant: FREESCALE SEMICONDUCTOR, INC., Austin, TX (US)

(72) Inventors: Jean-Phillippe Laine, Saint Lys (FR); Patrice Besse, Tournefeuille (FR); Changsoo Hong, Phoenix, AZ (US); Rouying Zhan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 84 days.

(21) Appl. No.: 14/846,168

(22) Filed: Sep. 4, 2015

(65) Prior Publication Data

US 2016/0300828 A1 Oct. 13, 2016

(30) Foreign Application Priority Data

Apr. 7, 2015 (WO) .................. PCT/IB2015/000627

(51) Int. Cl.
*H01L 27/00* (2006.01)
*H01L 21/00* (2006.01)
*H01L 21/266* (2006.01)
*H01L 27/082* (2006.01)
*H01L 29/06* (2006.01)
*H01L 29/10* (2006.01)
*H01L 27/02* (2006.01)

(52) U.S. Cl.
CPC ........ *H01L 21/266* (2013.01); *H01L 27/0259* (2013.01); *H01L 27/0262* (2013.01); *H01L 27/082* (2013.01); *H01L 29/0649* (2013.01); *H01L 29/1095* (2013.01)

(58) Field of Classification Search
CPC . H01L 29/7436; H01L 29/0262; H01L 29/87; H01L 21/74; H01L 21/823493; H01L 21/266; H01L 27/0259; H01L 27/0262; H01L 27/082; H01L 27/0649; H01L 29/1095
See application file for complete search history.

(56) References Cited

U.S. PATENT DOCUMENTS

| | | | |
|---|---|---|---|
| 6,441,437 B1 * | 8/2002 | Gossner | H01L 27/0248 257/355 |
| 6,878,581 B1 * | 4/2005 | Liu | H01L 27/027 257/E21.619 |
| 7,023,028 B2 * | 4/2006 | Jensen | H01L 27/0259 257/111 |
| 8,390,092 B2 | 3/2013 | Gendron et al. | |
| 2005/0082603 A1 * | 4/2005 | Fujii | H01L 29/1083 257/328 |

(Continued)

*Primary Examiner* — Dale E Page
*Assistant Examiner* — Quovaunda V Jefferson

(57) ABSTRACT

An electrostatic discharge protection device includes a buried layer having a plurality of heavily doped regions of a first conductivity type and a laterally diffused region between adjacent heavily doped regions, a semiconductor region over the buried layer, and a first well of the first conductivity type extending from a surface of the semiconductor region to a heavily doped region. The device includes a first transistor in the semiconductor region having an emitter coupled to the first terminal, and a second transistor in the semiconductor region having an emitter coupled to the second terminal. The first well forms a collector of the first transistor and a collector of the second transistor.

20 Claims, 11 Drawing Sheets

(56) References Cited

U.S. PATENT DOCUMENTS

| | | | |
|---|---|---|---|
| 2006/0091497 A1* | 5/2006 | Sato | H01L 29/0692 257/575 |
| 2012/0119331 A1* | 5/2012 | Gendron | H01L 29/7436 257/587 |
| 2014/0061716 A1* | 3/2014 | Zhan | H01L 29/87 257/110 |
| 2014/0225156 A1 | 8/2014 | Zhan et al. | |

* cited by examiner

ESD PROTECTION DEVICE

FIELD OF USE

The present disclosure relates generally to semiconductor devices, and more specifically, to semiconductor devices providing protection from electrostatic discharge (ESD).

BACKGROUND

Modern integrated circuits (ICs) and electronic assemblies, and the devices therein, are at risk of damage due to electrostatic discharge (ESD) events. This is well known in the art. Accordingly, it is commonplace to provide an ESD protection clamp (voltage limiting device) across the terminals of such devices, IC's and electronic circuits or assemblies. As used herein, the term integrated circuit and the abbreviation IC are intended to refer to any type of circuit or electronic assembly whether formed in a monolithic substrate or as individual elements or a combination thereof.

BRIEF DESCRIPTION OF THE DRAWINGS

The present disclosure is illustrated by way of examples, embodiments and the like and is not limited by the accompanying figures, in which like reference numbers indicate similar elements. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention. The figures along with the detailed description are incorporated and form part of the specification and serve to further illustrate examples, embodiments and the like, and explain various principles and advantages, in accordance with the present disclosure, where.

DETAILED DESCRIPTION

ESD protection clamps are circuit elements used to protect integrated circuit (IC) devices from voltage and current spikes that may be associated with an electrostatic discharge. To protect an IC device, an ESD clamp is connected between an input or output terminal of the device and a ground or common terminal. During normal operation, the ESD clamp does not conduct. But when subjected to an excessive voltage, the ESD clamp becomes conductive, conducting current to ground and limiting voltage to desired safe level, thereby protecting the IC to which the ESD clamp is connected.

Generally, ESD clamps can be connected across any terminals of an IC that constitutes the electronic device to be protected. Accordingly, any reference herein to a particular input or output terminal of an IC is intended to include any and all other terminals of electronic circuits, not merely those used for input or output signals. With respect to structures or elements used for ESD protection, the terms device, clamp and transistor are used interchangeably.

Figure 1:
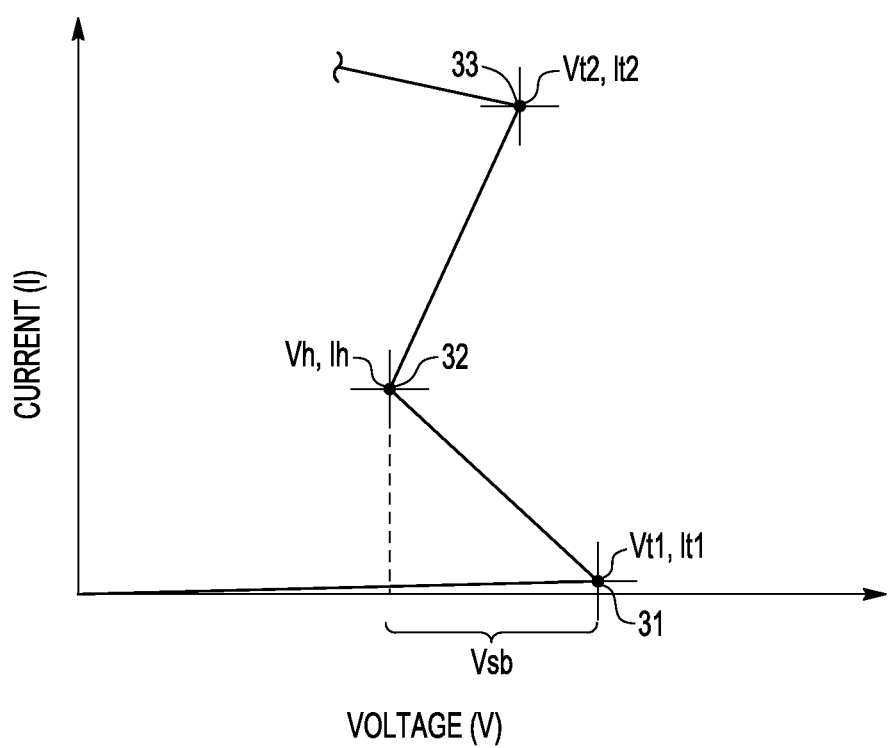
FIG. 1 illustrates a graph showing a transmission line pulse (TLP) current (I) versus voltage (V) for a typical electrostatic discharge (ESD) protection device.

FIG. 1 is a graph showing a transmission line pulse (TLP) current (I) versus voltage (V) for a typical electrostatic discharge (ESD) protection device. In operation, as the voltage applied to the terminals is increased, very little current flows through the ESD protection device until the triggering voltage Vt1 at point 31 is reached. It should be noted that the value Vt1 refers to forward triggering voltage. Upon reaching the triggering voltage, the ESD protection device turns on and the voltage drops to the holding voltage Vh at point 32, in which the current flow through the device is Ih. The difference between the triggering voltage and the holding voltage is referred to as the snapback voltage, referred to as Vsb. Depending upon the internal impedance of the voltage source, current and voltage may further increase to point 33 at current It2 and voltage Vt2, beyond which destructive failure may occur leading to further current increase accompanied by voltage decrease. Generally, It2 indicates the current capability of the ESD protection device before the device is thermally damaged.

Note that a similar explanation applies to the reverse direction in a bi-polarity or bi-directional ESD protection device in which very little current flows through the ESD protection device until a reverse triggering voltage $Vt1_R$ is reached. At this point, the ESD protection devices turns on and the voltage drops to a reverse holding voltage $Vh_R$. The reverse snapback voltage, $Vsb_R$, is the difference between the reverse triggering voltage and the reverse holding voltage. As will be described in more detail below, the forward behavior and reverse behavior of a bi-directional ESD protection device may not be symmetrical. That is, the ESD protection device may be optimized for either a forward or reverse ESD event.

In high-voltage or higher-power ESD clamp implementations (e.g., those used in the automotive industry) ESD clamps having a higher snapback voltage (Vsb) generally provide improved latch-up immunity. Typically, the snapback voltage and holding voltage of an ESD protection device is a constant voltage which is defined by the process technology used in manufacturing the ESD protection device. However, in some applications, this holding voltage value is not sufficient. For example, in one application, an electrical disturbance from the battery, such as for a reverse double battery event, may be on the order of 28V. In this situation, the holding voltage needs to remain above 28V in order for the ESD device to remain within allowable limits. Therefore, in one embodiment, a buried N type layer, as will be described below, is used to control or adjust the holding voltage by controlling the internal resistance of the ESD protection device.

Figure 2:
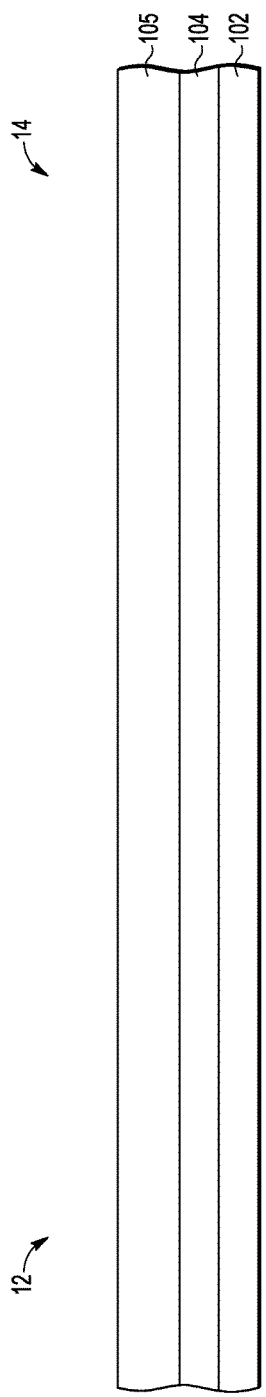
FIG. 2 illustrates a cross-sectional view of an ESD protection device implemented in a semiconductor substrate at a processing stage in accordance with an embodiment of the present invention.

FIG. 2 is a cross-sectional view of an ESD protection device 100 implemented in a semiconductor substrate at an initial stage in processing in accordance with an embodiment of the present invention. ESD protection device 100 is a dual polarity (bi-directional) ESD clamp device for use in protecting electronic devices and circuits. As will be described below, the ESD protection device will include two mirrored and interconnected transistors 124 and 126 and may be incorporated into an ESD protection clamp.

Illustrated in FIG. 2 is a substrate 102, in which ESD protection device 100 is formed over substrate 102. Substrate 102 is a semiconductor substrate and is provided with a buried oxide layer (BOX) 104. Depending upon the implementation, substrate 102 may be either of N-type or P-type. Substrate 102 includes a region 12 in which a first of the two mirrored interconnected transistors, transistor 124, will be formed and a region 14 in which a second of the two mirrored interconnected transistors, transistor 126, will be formed. Buried oxide layer 104 provides electrical isolation to devices formed over substrate 102. In some implementations of ESD protection device 100, however, BOX layer 104 may be excluded. For example, if there is no requirement that ESD protection device 100 be stackable (stacked configurations of multiple ESD protection devices are described below), BOX layer 104 is not required because the electric isolation provided by BOX layer 104 is not as important.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

Still referring to FIG. 2, a semiconductor layer 105 is formed over BOX layer 104. In one embodiment, semiconductor layer 105 is epitaxially deposited over BOX layer 104 and may be either N-type or P-type doped. In one embodiment, semiconductor layer 105 has a thickness in a range of 1 micrometer (μm) to 4 μm. As will be described below, an N-type buried layer (NBL) will be formed in semiconductor layer 105 using an appropriate masking layer and implantation. Note that regions 12 and 14 of substrate 102 may also correspond to a first region and a second region, respectively, of semiconductor layer 105.

Figure 3:
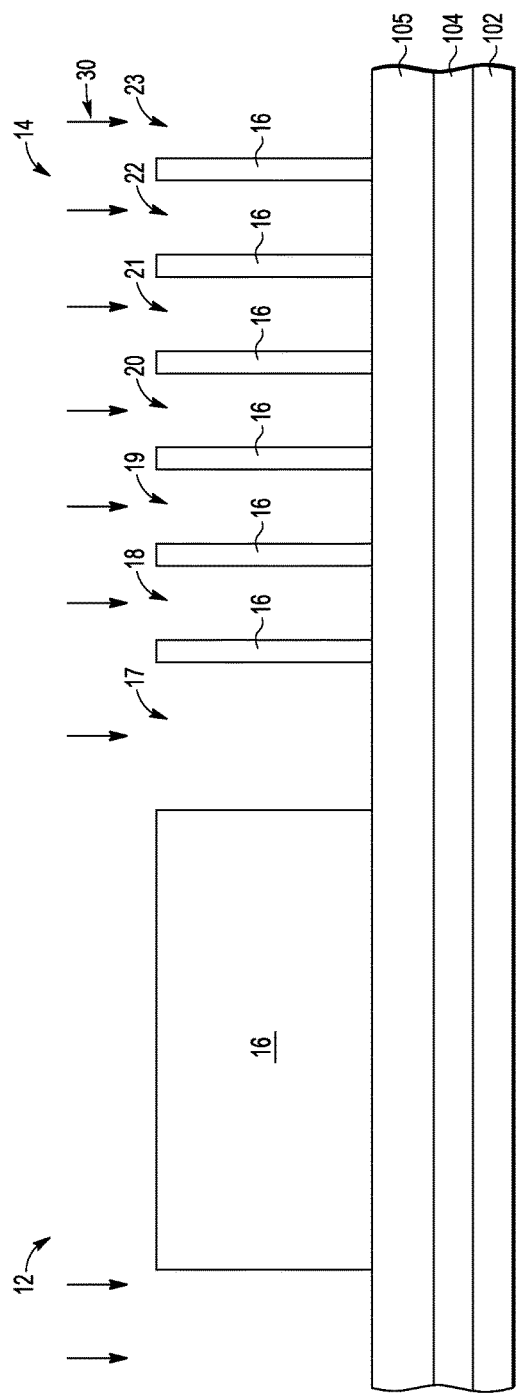
FIG. 3 illustrates a cross-sectional view of the ESD protection device of FIG. 2 at a subsequent processing stage in accordance with an embodiment of the present invention.

FIG. 3 illustrates ESD protection device 100 at a subsequent stage in processing in accordance with one embodiment. A patterned masking layer 16 is formed over semiconductor layer 105 and includes openings 17-23. In one embodiment, patterned masking layer 16 is formed by forming a photoresist layer over semiconductor layer 105 and then patterning the photoresist layer to form openings 17-23. Note that patterned masking layer 16 covers the first region of semiconductor layer 105 and openings 17-23 are formed over the second region of semiconductor layer 105. An implant 30 is then formed into semiconductor layer 105 to form doped regions within semiconductor layer 105 as defined by openings 17-23. Note that implant 30 enters semiconductor layer 105 in those regions exposed by the photoresist material and is blocked from entering semiconductor layer 105 in those regions covered by photoresist material.

In one embodiment, implant 30 is performed using an N-type dopant such as antimony, phosphorus, or suitable combinations thereof. In one embodiment, the peak doping density for the N-type implant is in the range of $1 \times 10^{16}$ cm$^{-3}$ to $1 \times 10^{19}$ cm$^{-3}$.

FIG. 3 illustrates ESD protection device 100 at a subsequent stage in processing, after removal of patterned masking layer 16. Implant 30 into semiconductor layer 105 results in highly doped regions 142-149 which are aligned to the openings in patterned masking layer 16, such as openings 17-23. After implant 30, dopants laterally diffuse from the highly doped regions by about 0.5 μm to 1 μm laterally, resulting in a laterally diffused region 150 around the highly doped regions. Laterally diffused region 150 has a lower dopant concentration than the highly doped regions. For example, the highly doped regions may have a dopant concentration of about $1 \times 10^{16}$ cm$^{-3}$ to about $1 \times 10^{19}$ cm$^{-3}$, while laterally diffused region 150 has a dopant concentration of about $1 \times 10^{15}$ cm$^{-3}$ to $1 \times 10^{16}$ cm$^{-3}$.

Doped regions 142-149 and laterally diffused region 150 form an N-type buried layer (NBL) 108. Due to patterned masking layer 16, NBL 108 is formed in region 14 but not in region 12. That is, in region 12, semiconductor layer 105 does not include doped regions resulting from implant 30. Therefore, NBL 108 may be described as having an opening in region 12 in which an undoped portion of semiconductor layer 105 is in direct contact with BOX layer 104. In region 14, due to patterned masking layer 16 which allows for the combination of highly doped regions and a laterally diffused region, NBL 108 still provides a continuous doped layer but with an overall lighter doping density as compared to using a patterned masking layer which exposes all of region 14. As will be discussed below, this also allows for NBL 108 to have an increased resistance. In alternate embodiments, a P-type buried layer, similar to NBL 108, may be formed in which implant 30 is performed using a P-type dopant and patterned masking layer 16.

Figure 4:
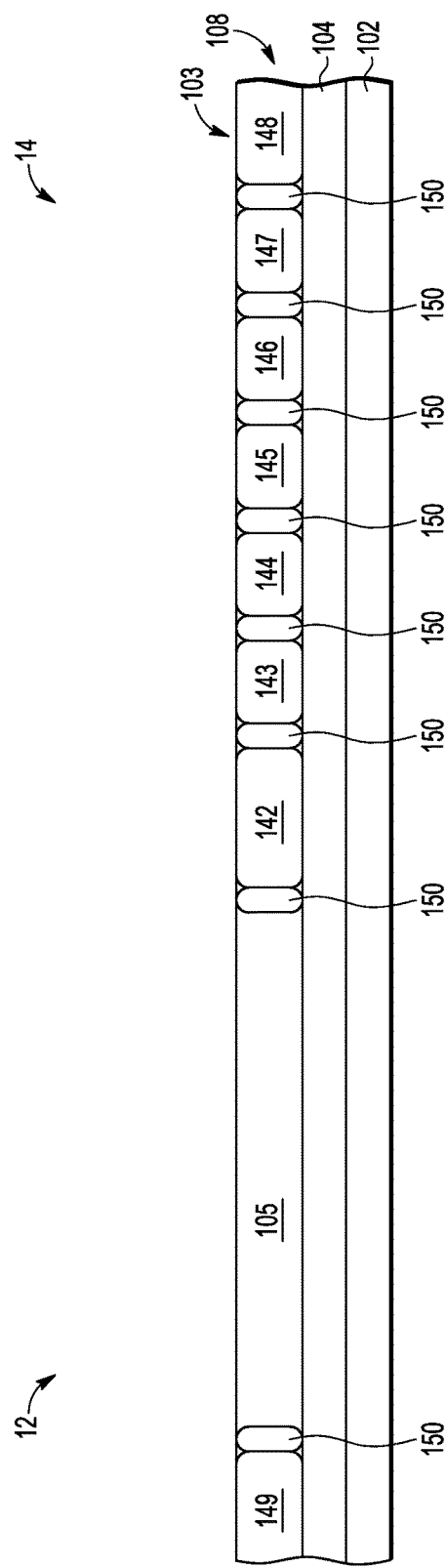
FIG. 4 illustrates a cross-sectional view of the ESD protection device of FIG. 3 at a subsequent processing stage in accordance with an embodiment of the present invention.
Figure 5:
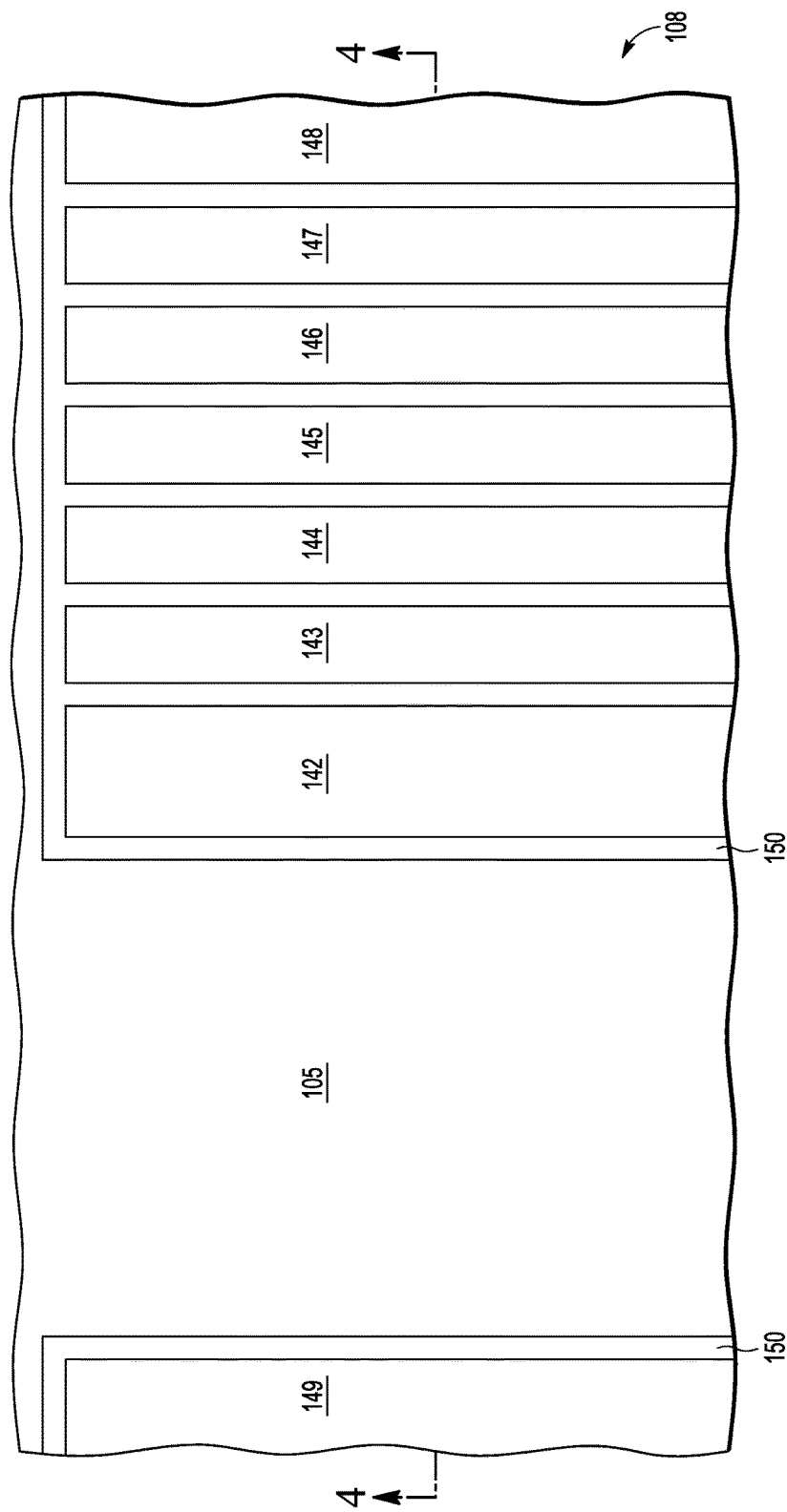
FIGS. 5 and 6 illustrate a top down view of a portion of the ESD protection device of FIG. 4 in accordance with various embodiments of the present invention.
Figure 6:
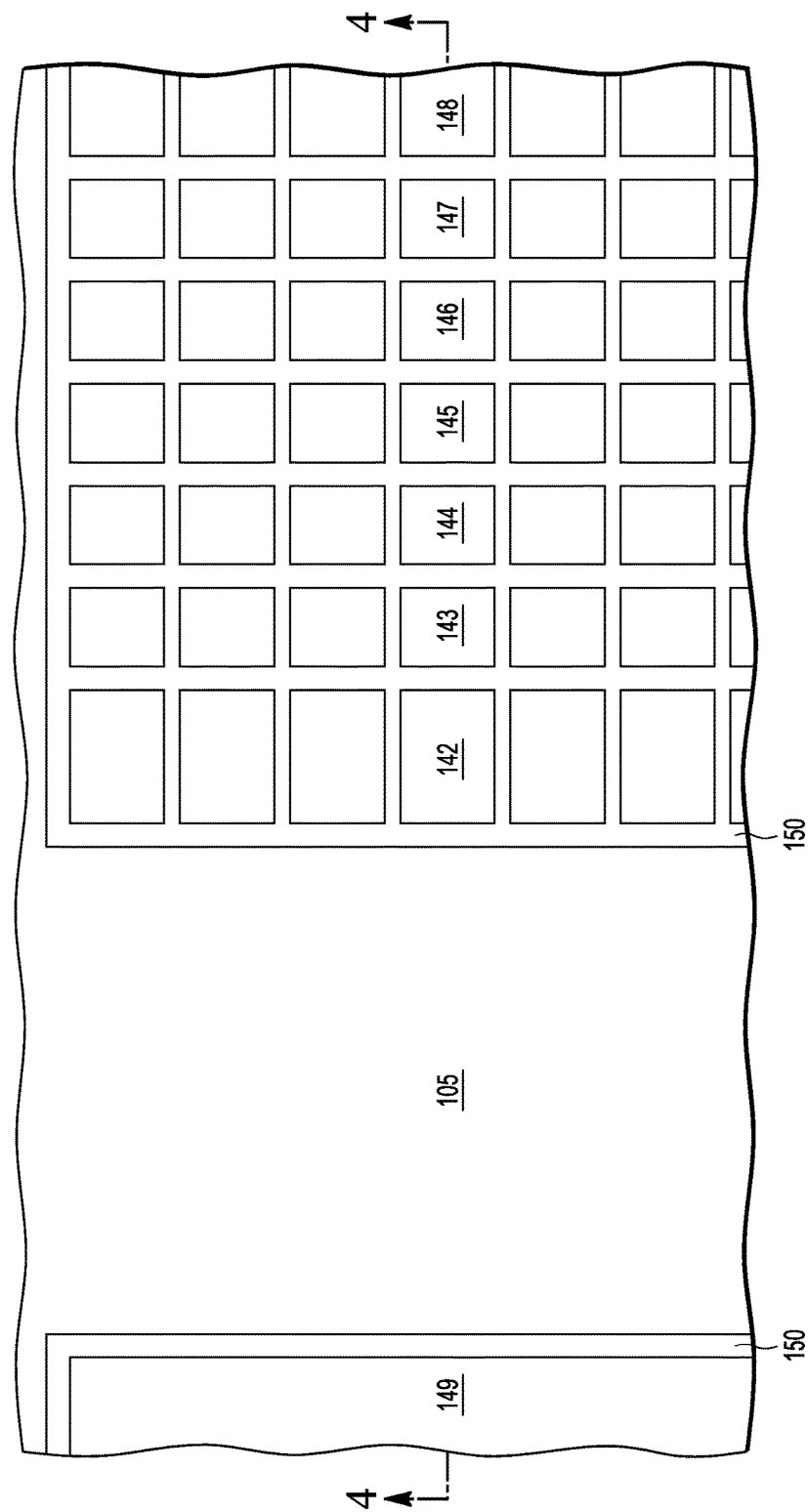

FIGS. 5 and 6 illustrate a top down views of a portion of ESD protection device 100 of FIG. 4 in accordance with various embodiments. Openings 17-23 of patterned masking layer 16, which define the highly doped regions 142-148 in region 14, are spaced apart from each other but may be of any shape. For example, as illustrated in FIG. 5, openings 17-23 may be rectangular in shape in a striped formation, resulting in elongated, substantially rectangular shaped, highly doped regions 142-148 in a striped formation in a plane parallel to a major surface 103 of NBL 108 (which corresponds to a major surface of semiconductor layer 105 in which NBL 108 is formed). Therefore, the major axes of the elongated highly doped regions 142-148 are parallel to major surface 103 of NBL 108. Alternatively, as illustrated in FIG. 6, openings 17-23 may be square or rectangular in shape in a grid formation, resulting in substantially square or rectangular shaped highly doped regions 142-148 in a grid formation in a plane parallel to major surface 103 of semiconductor layer 105. The grid formation may include an array of N×M openings in patterned masking layer 16, resulting in an N×M array of highly doped regions in a plane parallel to major surface 103 of NBL 108. Each of N and M may be an integer greater than or equal to one. In either embodiment, regardless of the resulting shape of the highly doped regions, laterally diffused region 150 surrounds each highly doped region in a plane parallel to major surface 103. Note that major surface 103 of NBL 108 is parallel to a major surface of ESD protection device 100.

The openings in patterned masking layer 16 have a spacing between each other, corresponding to the resulting spacing between adjacent highly doped regions formed in semiconductor layer 105. The spacing between adjacent openings in patterned masking layer 16 is sufficiently small to allow the lateral diffusion between adjacent highly doped regions to overlap, so as to ensure a continuous doped layer for NBL 108. That is, if the spacing is too large, the lateral diffusion between adjacent highly doped regions would not meet or overlap, resulting in a doping break in semiconductor layer 105 and thus resulting in a non-contiguous NBL within region 14. Also, this spacing requirement should be met between any two adjacent openings in patterned masking layer 16 used to form NBL 108 in region 14 in order ensure a continuous doped layer for NBL 108 in any direction within the plane of semiconductor layer 105. In one embodiment, the spacing between adjacent openings is at least 0.5 μm.

Figure 7:
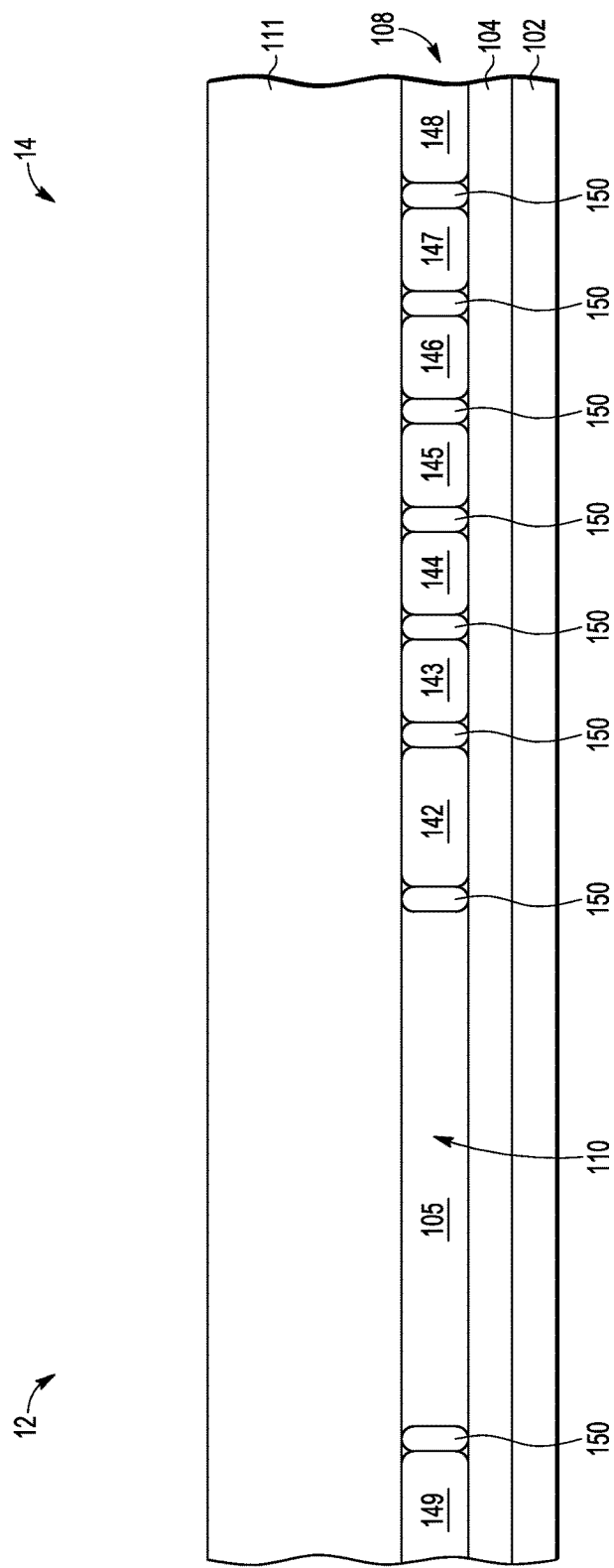
FIG. 7 illustrates a cross-sectional view of the ESD protection device of FIG. 4 at a subsequent processing stage in accordance with an embodiment of the present invention.

FIG. 7 illustrates ESD protection device 100 at a subsequent stage in processing. After formation of the doped regions in semiconductor layer 105 to form NBL 108, a semiconductor layer 111 is formed over semiconductor layer 105 and NBL 108. In one embodiment, semiconductor layer 111 is formed by epitaxial deposition of silicon and may be either N-type or P-type doped. An example doping concentration range of region 111 is about $1\times10^{15}$ cm$^{-3}$ to about $8\times10^{15}$ cm$^{-3}$. As such, layer 111 may be relatively lightly doped. The thickness of layer 111 is in the range of 3 μm to about 9 μm in some embodiments.

As shown in FIG. 7, NBL 108 is not continuous through ESD protection device 100. Instead, NBL 108, once formed, defines a portion or region 110 in which semiconductor layer 111 is in contact with semiconductor layer 105 which is in contact with BOX layer 104. That is, portion or region 110 is located within an opening of NBL 108 in region 12. As such, NBL 108 does not form a continuous layer of N-type material formed across the surface of BOX layer 104. As described above, NBL 108 is continuous in region 14 but not in region 12. The combination of semiconductor layer 111 and the portions of semiconductor layer 105 which do not include NBL 108 (such as the portion of semiconductor layer 105 in region 110) may be referred to as a semiconductor region 112. As such, region 112 is formed over NBL 108 and BOX layer 104. For region 110, region 112 comes into contact with BOX layer 104.

Figure 8:
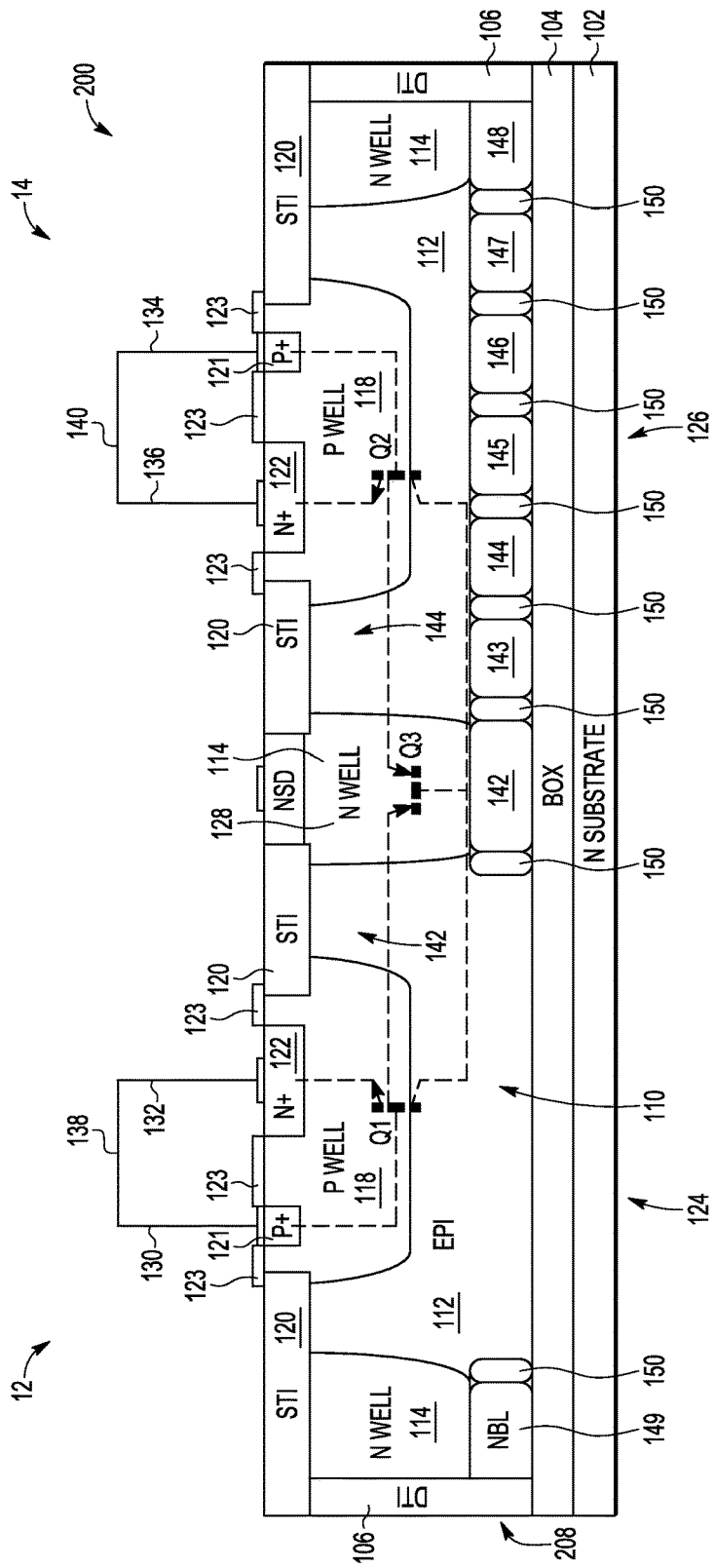
FIG. 8 illustrates a cross-sectional view of the ESD protection device of FIG. 7 at a subsequent processing stage in accordance with an embodiment of the present invention.

FIG. 8 illustrates ESD protection device 100 at a subsequent stage in processing in which transistor 124 of ESD protection device 100 is formed in region 12 and transistor 126 of protection device 100 is formed in region 14. After formation of semiconductor layer 111 which results in region 112, a number of deep N-well regions 114 are formed in region 112. N well regions 114 may be doped with arsenic, phosphorus, antimony, or suitable combinations thereof. The peak doping density for N-well regions 114 may be in a range of about $1\times10^{17}$ cm$^{-3}$ to about $1\times10^{19}$ cm$^{-3}$ although other doping densities may also be used N-well regions 114 are formed to be in contact (and, therefore, in electrical communication with) NBL 108. Note that N-well regions 114 are in contact (and in electrically communication with) highly doped regions of NBL 108, such as regions 149, 142, and 148. In one embodiment, N-well regions 114 are formed such that the entire bottom of each deep N-well region contacts a highly doped region of NBL 108 and thus does not contact laterally diffused region 150.

After formation of N-well regions 114, a number of shallow trench isolation (STI) structures 120 are formed over a surface of device 100. The depth of STI structures 120 is usually in the range of about 0.05 μm to about 1 μm, more conveniently about 0.2 μm to about 0.5 μm, although thicker or thinner STI structures may also be used.

To fully isolate devices formed over substrate 102, deep trench isolation (DTI) regions 106 are formed to provide electrically insulating walls around the devices. DTI regions 106 include dielectric materials that provide lateral electrical isolation to the device. Deep trench isolation regions are provided extending from the surface of ESD device 100 to BOX 104. For example, DTI regions 106 extend through NBL 108 to BOX 104.

P-well regions 118 are formed within region 112. P-well regions 118 may be doped with boron or other suitable dopants. The peak doping density for P-well regions 118 is in the range of about $1\times10^{16}$ cm$^{-3}$ to about $1\times10^{19}$ cm$^{-3}$. The depth of P-well regions 118 may be in the range of 0.3 μm from the surface of device 100, to any location above or in contact with NBL 108, but other depth may also be used.

A number of silicide block regions 123 can be formed over the surface of device 100 to prevent reaction with a silicide forming conductor (that may be deposited over the device at a later time). In one embodiment, the silicide block regions 123 include a first layer of silicon oxide overlaying the surface, followed by a second layer of silicon nitride overlapping the first layer. While in another embodiment, the silicide block regions 123 may be omitted. In some cases, the silicide block regions 123 are replaced using shallow trench isolation (STI).

N+ doped contact regions 122 are formed in P-well regions 118. N+ contact regions 122 include relatively shallow, but highly doped N-type regions and may include phosphorus, arsenic, or suitable combinations thereof as dopants. The peak doping density for N+ contact regions 122 can be in the range of about $5\times10^{19}$ cm$^{-3}$ to about $1\times10^{21}$ cm$^{-3}$. The depth of N+ contact regions 122 can range from about 0.05 μm to about 0.3 μm. Other dopants, density and depths, though, may also be used.

P+ doped contact regions 121 are formed in P-well regions 118 to make electrical contact with P-well regions 118. P+ contact regions 121 include relatively shallow, but highly doped P regions and may include boron as a dopant. The peak doping density for P+ contact regions 121 is in the range of about $5\times10^{19}$ cm$^{-3}$ to about $1\times10^{21}$ cm$^{-3}$. The depth of P+ contact regions 120 can range from about 0.05 µm to about 0.3 µm. But other dopants, density and depths may also be used.

In the configuration shown in FIG. 8, the structure forms two NPN bipolar junction transistors 124 and 126, in which transistor 124 is formed in region 12 and transistor 126 in region 14. To illustrate the location and electrical interconnection of transistors 124 and 126 within the device, FIG. 8 includes a dashed schematic overlay showing the approximate location of a number of transistor structures within device 100. In the overlay, transistor 124 is represented by transistor Q1 and transistor 126 is represented by transistor Q2. In FIG. 8, transistors Q1, Q2, Q3 (described below), and their interconnections are only included for reference and do not form any portion of the structure of device 100. In FIG. 8, N+ doped regions 122 serve as the emitters of transistors 124 and 126. P-well regions 118 serve as the bases of transistors 124 and 126. The N-well region 128 (and connected NBL region 108) serve as the shared collector of transistors 124 and 126. The base and emitter terminals (130 and 132, respectively) of transistor 124 are tied together to form cathode terminal 138 for ESD protection device 100. The base and emitter terminals (134 and 136, respectively) of transistor 126 are tied together to form anode 140 terminal for ESD protection device 100. In this configuration, a parasitic PNP transistor structure is formed in device 100 at the approximate location of transistor Q3 on FIG. 8. N-well region 128 and the adjoining NBL region 108 serve as the base of the transistor structure Q3, and P-well regions 118 serve as the emitter and collector of transistor structure Q3. In the present device, the portion of NBL 108 formed under transistor 126 enables the operation of the parasitic PNP transistor structure Q3.

During a forward ESD event, when a positive voltage is applied to terminal 140 with respect to terminal 138, transistor 126 acts as a forward-biased diode, and transistor 124's base-collector junction is reverse biased. When a sufficiently large voltage is applied to terminal 140 with respect to terminal 138, intermediate portion 142 of region 112 becomes depleted of free carriers. As the applied voltage increases to Vt1, avalanche breakdown occurs across the base-collector spacing in portion 142 of region 112. Thus, the (forward) triggering voltage Vt1 at which avalanche breakdown occurs in transistor 124 can depend upon the base-collector spacing between P-well 118 and N-well 128 within transistor 124; the larger the spacing, the higher Vt1 and, conversely, the smaller the spacing, the smaller Vt1. As the applied voltage increases above Vt1, the avalanche breakdown generates carriers turning on NPN transistor 124 (Q1). NPN transistor 124 (Q1) then couples with PNP transistor structure Q3 so that the base of transistor 124 (Q1) also serves as and connects to the collector of transistor structure Q3, and the collector of transistor 124 (Q1) serves as and connects to the base of transistor structure Q3. The coupling between transistor 124 and transistor structure Q3 forms a parasitic silicon controlled rectifier (SCR). The parasitic SCR effects provide strong current capability for the present device after the device snaps back and begins conducting.

Figure 9:
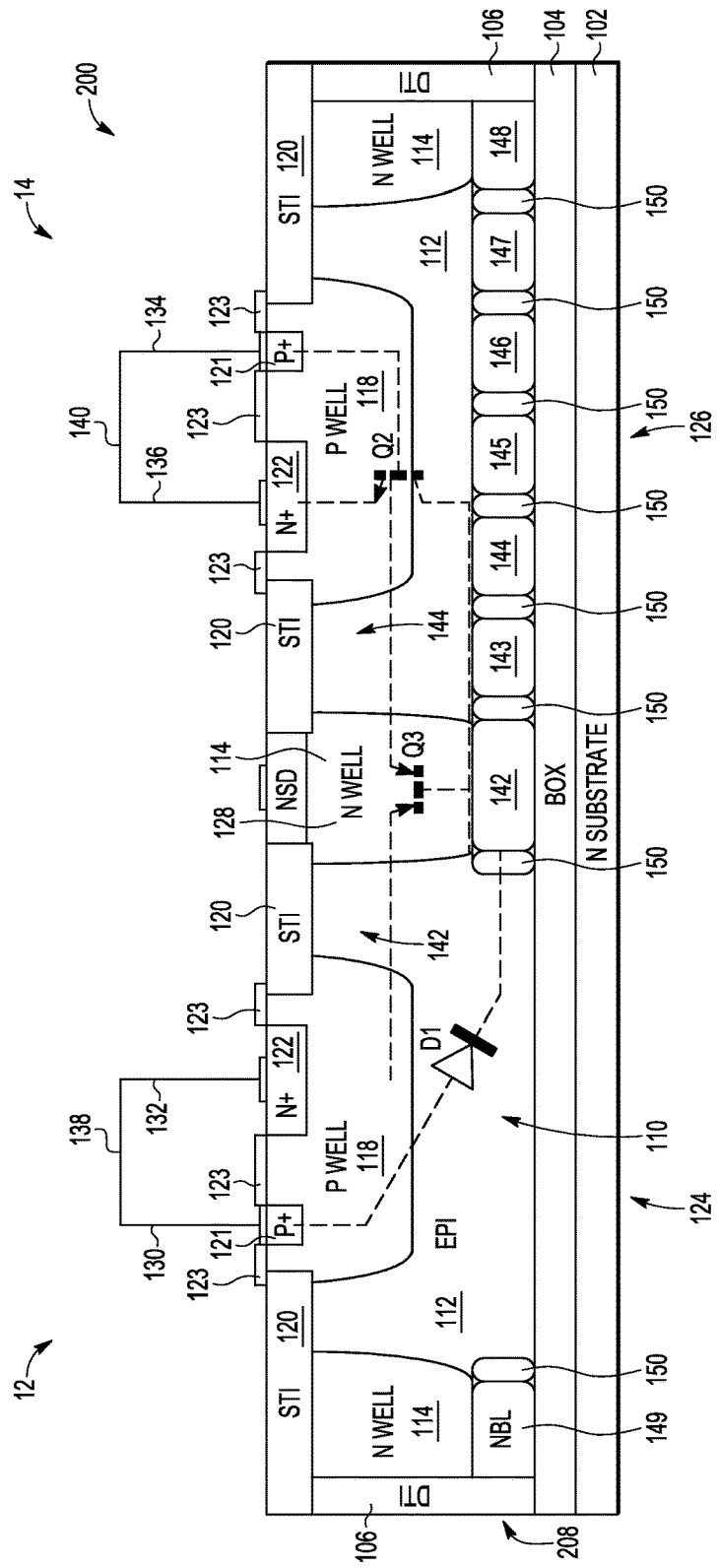
FIG. 9 illustrates a cross-sectional view of the ESD protection device of FIG. 8 during operation with a schematic representation overlay in accordance with an embodiment of the present invention.

Conversely, during a reverse ESD event, when a negative voltage is applied to terminal 140 with respect to terminal 138, transistor 124 acts as a forward-biased diode and transistor 126's base-collector junction is reverse biased. This example is illustrated by the overlay schematic in FIG. 9 illustrating a forward-biased diode, D1, in place of transistor Q1. When a negative voltage with sufficiently large amplitude is applied to terminal 138 with respect to terminal 140, intermediate portion 144 of region 112 becomes depleted of free carriers. As the applied voltage increases to Vt1$_R$, avalanche breakdown occurs across the base-collector spacing in portion 144 of region 110. Thus, the reverse triggering voltage Vt1$_R$ at which avalanche breakdown occurs in transistor 126 can depend upon the base-collector spacing between P-well 118 and N-well 128 within transistor 126; the larger the spacing, the higher Vt1$_R$ and, conversely, the smaller the spacing, the smaller Vt1$_R$. As the applied voltage increases above Vt1$_R$, the avalanche breakdown generates carriers to turn on NPN transistor 126 (Q2). NPN transistor 126 (Q2) then couples with PNP transistor structure Q3 in a way that the base of transistor 126 (Q2) also serves as and connects to the collector of transistor structure Q3, and the collector of transistor 126 (Q2) serves as and connects to the base of Q3. The coupling between transistor 126 and transistor structure Q3 also forms a parasitic SCR. The parasitic SCR effects provide strong reverse current capability for the present device after the device snaps back and start conducting.

The forward and reverse triggering voltages Vt1 and Vt1$_R$ may be substantially the same or different depending on whether the base-collector spacings in portions 142 and 144 are substantially the same or different.

In the arrangement shown in FIG. 8, transistor 124 controls the forward triggering of ESD protection device 100 during a forward ESD event. The parasitic SCR formed by transistor 124 and transistor structure Q3 controls the forward holding voltage of ESD protection device 100 after the applied voltage exceeds Vt1 for the device (and so the device begins to snapback and conduct current). Transistor 126 controls the reverse triggering of ESD protection device 100 during a reverse ESD event. The parasitic SCR formed by transistor 126 and transistor structure Q3 controls the reverse holding voltage of ESD protection device 100 after the applied voltage exceeds Vt1$_R$ for the device (and the device begins to snapback and conduct current.

In a conventional dual-polarity ESD protection device having a full, uniformly implanted NBL, a substantial amount of current flows through the NBL that is located under each transistor. However, in ESD device 100 as illustrated in FIGS. 8 and 9, NBL 108 is not present in portion 110. As a result, after the device is triggered, no current flows through NBL 108 for transistor 124. This behavior increases the forward holding voltage, Vh$_R$ of the device, improving its performance. Furthermore, in ESD device 100, NBL 108 under transistor 126 includes highly doped regions as well as a laterally diffused region between adjacent highly doped regions which results in increased resistance of NBL 108 while ESD protection device 100 is conducting current. This results in further increased forward and reverse holding voltages and thus improved performance. However, since NBL 108 is located under transistor 126 which, along with Q3, controls the reverse holding voltage, the reverse holding voltage is increased more during a reverse ESD event than the forward holding voltage is increased during a forward ESD event. In this manner, ESD protection device 100 is optimized for a reverse ESD event as compared to a forward ESD event.

Figure 10:
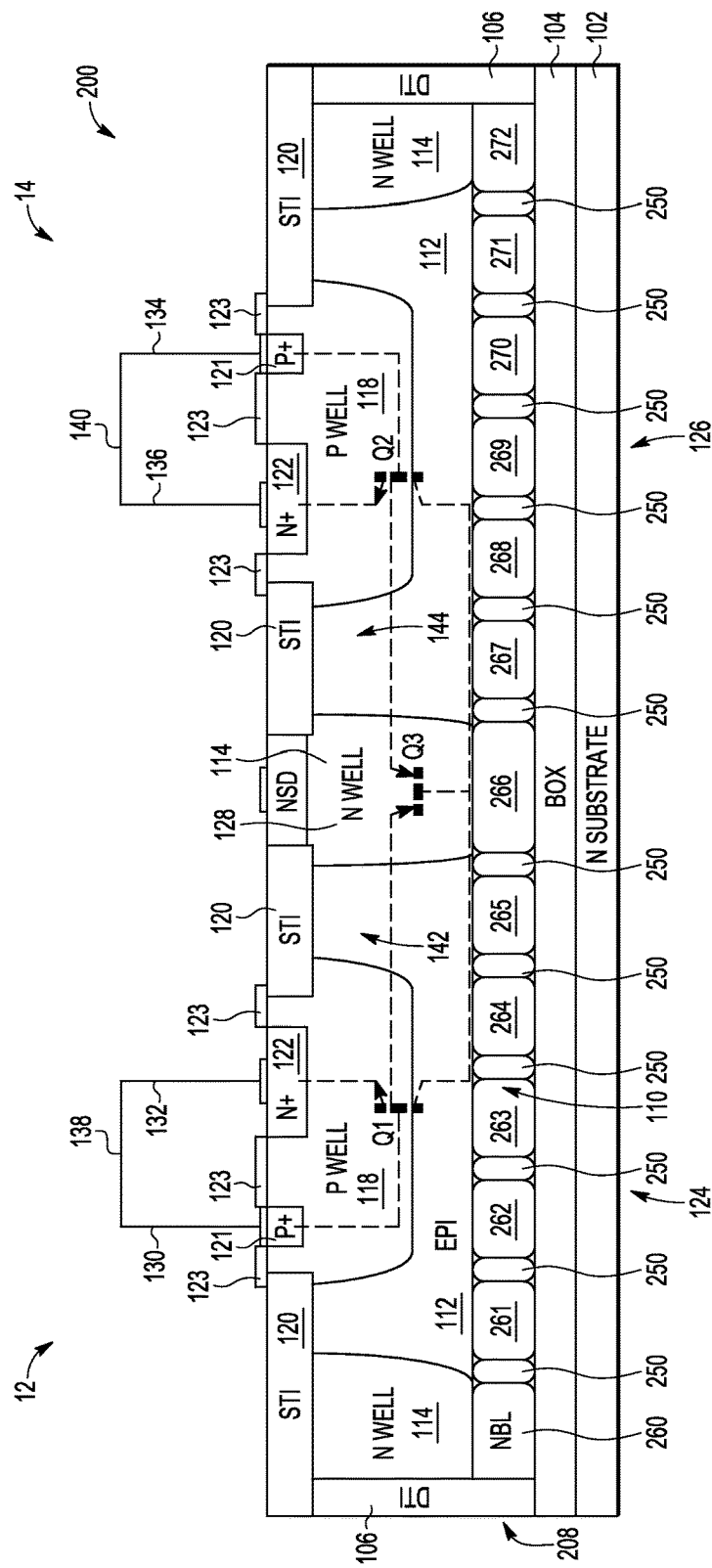
FIG. 10 illustrates a cross-sectional view of an ESD protection device in accordance with another embodiment of the present invention.

FIG. 10 illustrates a cross-sectional view of a bi-polarity ESD protection device 200 in accordance with an embodiment of the present invention. ESD protection device 200 is similar to ESD protection device 100 in which like numerals indicate like elements. Unlike ESD protection device 100, an N-type buried layer 208 is formed in semiconductor layer 105 which is located across the wafer, under both transistors 124 and 126. However, NBL 208, like NBL 108, includes highly doped regions 260-272 and a laterally diffused region 250 located between the highly doped regions. Therefore, NBL 208 is continuous across the wafer but includes highly doped regions as well as a lighter doped laterally diffused region.

Figure 11:
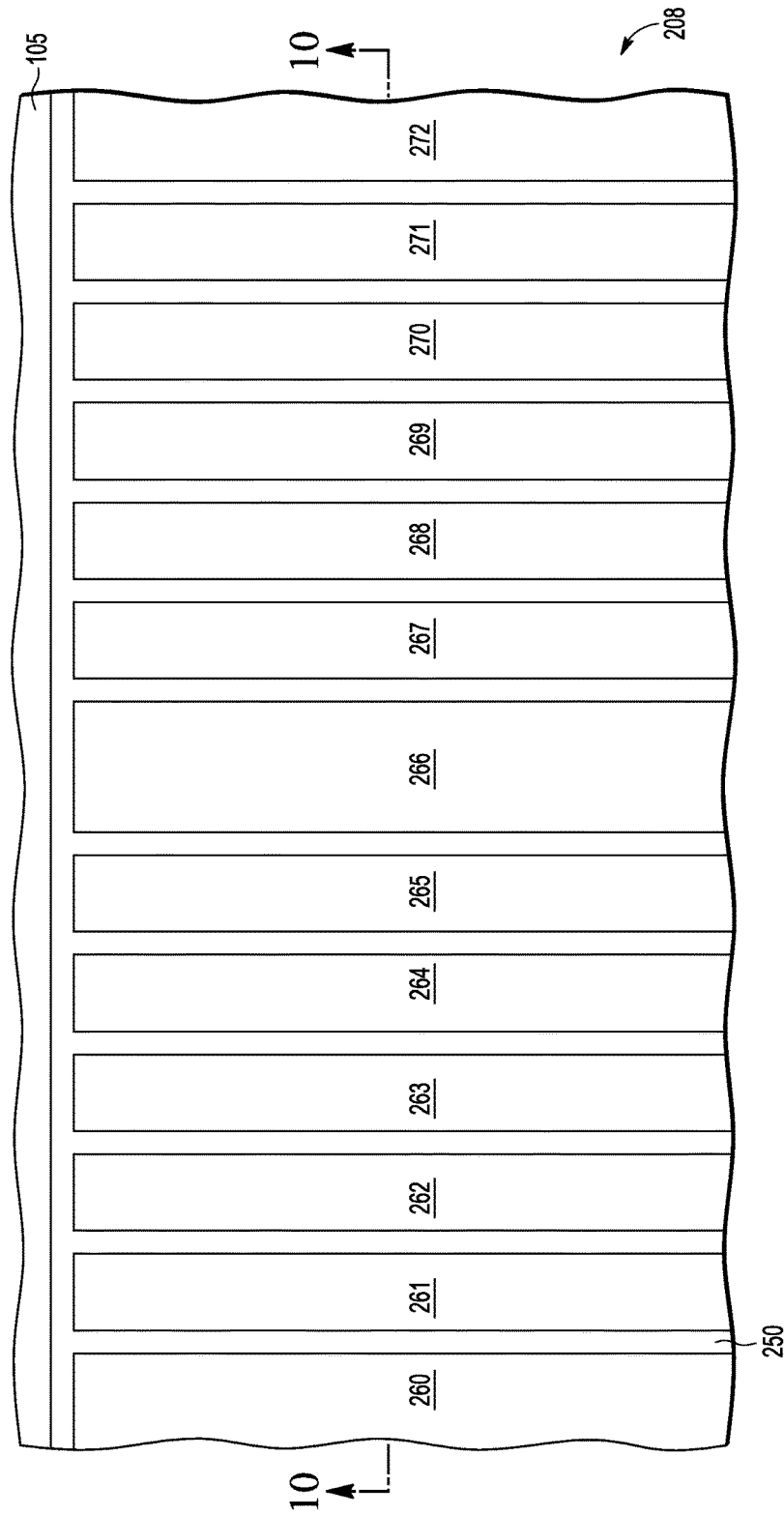
FIG. 11 illustrates a top down view of a portion of the ESD protection device of FIG. 10 in accordance with an embodiment of the present invention.

FIG. 11 illustrates a top down view of a portion of ESD protection device 200 of FIG. 10 in which highly doped regions 260-272 are rectangular in shape and in a striped formation. As described above, a patterned masking layer, similar to patterned masking layer 16, may be used to perform an implant like implant 30 into semiconductor layer 105 which has corresponding rectangular openings to result in highly doped regions 260-272. In yet another alternate embodiment, the highly doped regions of NBL 208 may have different shapes, such as a rectangular or square shape, and may be formed in different formations, such as in a grid formation, as illustrated in FIG. 6.

The embodiment of FIG. 10 does not include region 110 in which region 112 is in contact with BOX layer 104. That is, NBL 208 is located between semiconductor layer 11 and BOX layer 104 in both regions 12 and 14, and thus is located under both transistors 124 and 126. Therefore, during ESD events, current flows in NBL 208 under each transistor 124 and 126. However, in contrast to the conventional dual-polarity ESD protection device having a full, uniformly implanted NBL, increased resistance is still achieved which results in increased forward and reverse holding voltages. However, the increase in holding voltages may be less than achieved with the embodiment of FIG. 8.

Because ESD protection device 100 or 200 can be constructed using silicon-on-insulator fabrication process, the ESD protection device is isolated by buried oxide layer (BOX) and deep trench isolation (DTI), as described above. This configuration allows the device to be stacked. This capability minimizes device footprint when a number of the present ESD protection devices are stacked over one another. The stacking of the present ESD protection devices allows for the formation of a single ESD protection clamp that includes a number of ESD protection devices and that can provide an increased Vh.

When stacked within an ESD protection clamp, two or more ESD protections devices are formed next to one another in a single substrate. The ESD protection devices are then connected in series (i.e., stacked) with the cathode of one ESD protection device being electrically connected to the anode of the next ESD device. The anode of the first ESD protection device in the stack provides a positive input or anode terminal for the ESD protection clamp. Similarly, the cathode of the last ESD protection device in the stack provides a negative input or cathode terminal for the ESD protection clamp. The positive and negative input terminals of the ESD protection clamp can then be connected to an IC device to provide protection thereto.

Figure 12A:
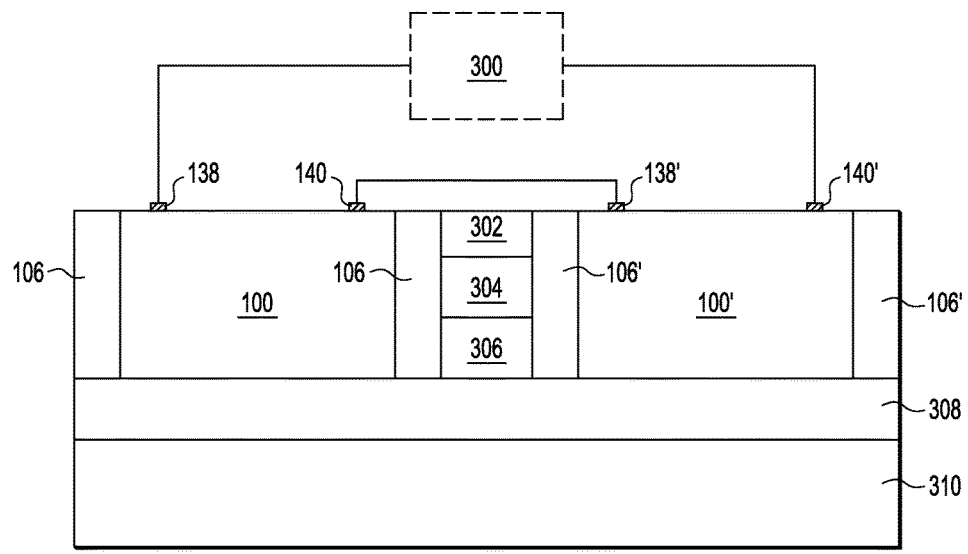
FIGS. 12A and 12B illustrate cross-sectional views of an electrostatic discharge protection clamp including two stacked ESD protection devices in accordance with various embodiments of the present invention.
Figure 12B:
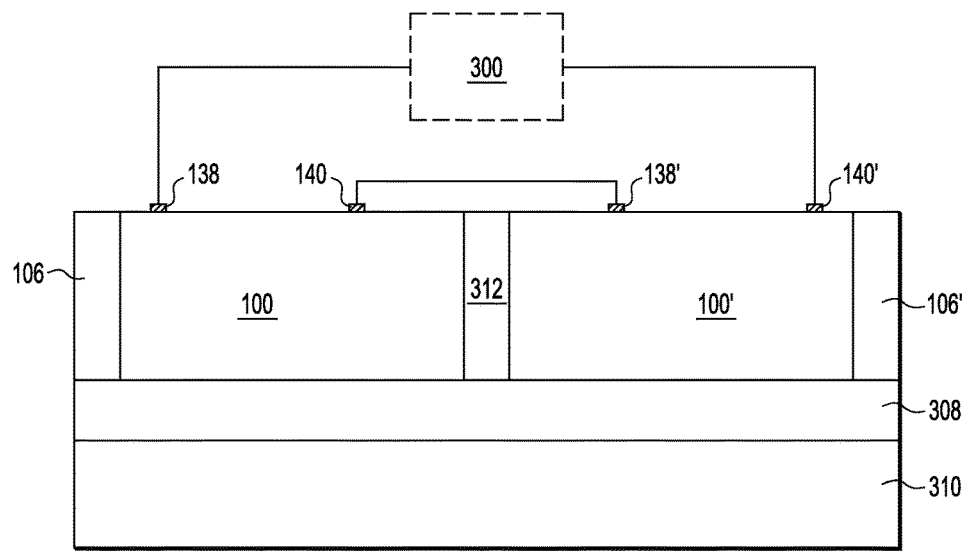

FIGS. 12A and 12B, for example, are cross-sectional views of an ESD protection clamp that includes two stacked ESD protection devices. In FIG. 12A two ESD protection devices 100 and 100' are connected in series, though other devices or clamps could include more than two series-connected ESD protection devices. In the arrangement shown in FIG. 12A, device 100' is the first ESD protection device in the stacked device and device 100 is the second ESD protection device.

Each of devices 100 and 100' in FIG. 12A are configured in accordance with the example device 100 shown in FIG. 8, however, the DTI regions 106 of each device have been duplicated in FIG. 12A. (Alternatively, each of devices 100 and 100' in FIG. 12A are configured in accordance with the example device 200 shown in FIG. 10.) FIG. 12A also shows the substrate 310 and BOX layer 308 over which each ESD protection device is formed.

Each of the devices 100 and 100' are electrically isolated by DTI regions 106 (DTI regions 106 surround device 100 and DTI regions 106' surround device 100') from N type or P type region (formed by epitaxial deposition) 306 and in some embodiment P well region 304. STI structure 302 is provided for additional isolation.

To interconnect the devices, cathode 138' of device 100' is connected to anode 140 of device 100, thereby connecting devices 100 and 100' in series. The anode 140' of device 100' is connected to a first terminal (e.g., a positive terminal Vpos) of IC device 300. The cathode 138 of the stacked ESD protection device 100 is connected to a second terminal (e.g., a negative terminal Vneg) of IC device 300. In this configuration, the stacked ESD protection devices 100 and 100' operate as an ESD protection clamp to provide protection to IC device 300.

FIG. 12B is a cross-sectional view showing two stacked ESD protection devices 100 and 100', where the devices are isolated from one another using an alternative trench structure. In FIG. 12B, devices 100 and 100' of FIG. 12A are separated by a single DTI trench region 312 that provides electrical isolation between the two devices 100 and 100'. In this arrangement, device 100' is the first ESD protection device in the stacked arrangement and device 100 is the second ESD protection device.

Again, the cathode 138' of device 100' is connected to the anode 140 of device 100, connecting devices 100 and 100' in series. The anode 140' of device 100' is connected to a first terminal of IC device 300, where IC device 300 is to be protected by the stacked ESD protection device. The cathode 138 of the stacked ESD protection device 100 is connected to a second terminal of IC device 300.

Using the configuration shown in FIGS. 12A and 12B any number of ESD protection devices can be combined, in series, to form an ESD protection clamp. The anode of the first ESD protection device in the stack and the cathode of the last ESD protection device in the stack can then be connected to an IC device to provide protection thereto.

When two or more ESD protection devices are stacked as shown in FIG. 12A or FIG. 12B, the holding voltage Vh of the entire stacked device is equal to the sum of the holding voltages of each of individual ESD protection devices 100. As such, to provide a protection device that targets a holding voltage of 30V, a stack that includes two or more ESD protection devices connected in series can be used. For example, the holding voltage of each individual ESD protection device may be approximately 15V. In the example described above regarding the reverse double battery event of about 28V, a holding voltage of 30V remains within the allowable limit. The doping profile of NBL 108 or 208 can therefore be used to control the holding voltage of ESD protection devices, and ESD protection devices can be stacked in series as needed to provide the desired final holding voltage.

While ESD protection devices 100 and 200 have been described as being formed on an SOI substrate in which transistors 124 and 126 of the ESD protection device are isolated by BOX layer 104, alternate embodiments may form ESD protection devices 100 and 200, with NBL layers 108 and 208, respectively, on a bulk substrate with junction isolation. This substrate can either be a lightly doped P type substrate, or a P type epitaxy layer over a highly doped P type substrate. The ESD protection device can be isolated on each side by deep drench isolation (DTI) regions or bulk regions.

Therefore, by now it can be appreciated how the doping profile of a buried layer below one or both transistors of a bi-directional ESD protection device can be used to control the holding voltage of the ESD protection device. For example, a masking layer having a plurality of openings, such as in a stripe formation or grid formation, can be used for an implant into a semiconductor layer to form a buried layer having a plurality of heavily doped regions. Since dopants extend laterally from the heavily doped regions in the semiconductor layer, each of the heavily doped regions includes a surrounding laterally diffused region. This allows for the formation of a continuous buried layer whose resistance can be controlled by the formation of the heavily doped region in combination with the laterally diffused region. In this manner, holding voltages of the ESD protection device can be controlled.

The following detailed description is exemplary in nature and is not intended to limit the invention or the application and uses of the same. Furthermore, there is no intention to be bound by any expressed or implied theory presented in the preceding technical field, background, or the following detailed description.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

One embodiment relates to an electrostatic protection device coupled between a first terminal and a second terminal of an integrated circuit. The electrostatic protection device includes a buried layer having a plurality of heavily doped regions of a first conductivity type and a laterally diffused region of the first conductivity type between adjacent heavily doped regions of the plurality of heavily doped regions; a semiconductor region over the buried layer; a first well of the first conductivity type in the semiconductor region, extending from a surface of the semiconductor region to a heavily doped region of the plurality of heavily doped regions of the buried layer; a first transistor in the semiconductor region having an emitter coupled to the first terminal; and a second transistor in the semiconductor region having an emitter coupled to the second terminal. The first well forms a collector of the first transistor and a collector of the second transistor, and the buried layer is located below at least one of the first transistor and the second transistor. In one aspect, the buried layer is located below only one of the first transistor and the second transistor. In another aspect, the plurality of heavily doped regions are in a stripe formation in a plane parallel to a major surface of the buried layer. In another aspect, the plurality of heavily doped regions form an N×M array in a plane parallel to a major surface of the buried layer, wherein each of N and M are integers greater than or equal to one. In another aspect, each heavily doped region of the plurality of heavily doped regions is surrounded by the laterally diffused region in a plane parallel to a major surface of the buried layer. In a further aspect, the plurality of heavily doped regions and the laterally diffused region form a continuous layer of the first conductivity type, and wherein the semiconductor region is of a second conductivity type different from the first conductivity type. In yet another aspect of the above embodiment, the plurality of heavily doped regions are more heavily doped as compared to the laterally diffused region. In another aspect, the electrostatic protection device further includes a substrate; and an insulating layer over the substrate, wherein the buried layer and the semiconductor region is over the insulating layer.

Another embodiment relates to a method for forming an electrostatic protection device coupled between a first terminal and a second terminal of an integrated circuit in which the method includes forming a patterned masking layer over a first region and a second region of a first semiconductor layer. The patterned masking layer includes a plurality of openings which expose portions of at least one of the first region and the second region of the first semiconductor layer. The method further includes implanting a dopant of a first conductivity type into the first semiconductor layer using the patterned masking layer, wherein the implanting results in a plurality of highly doped regions in the first semiconductor layer, and wherein, after implanting, dopants extend laterally from the plurality of highly doped region into the first semiconductor layer to form a laterally diffused dopant region. The method further includes forming a second semiconductor layer over the first semiconductor layer and the plurality of highly doped regions; forming a first well of the first conductivity type in the second semiconductor layer, extending from a surface of the second semiconductor layer to a heavily doped region of the plurality of heavily doped regions; forming a first transistor in the second semiconductor layer over the first semiconductor layer and having an emitter coupled to the first terminal; and forming a second transistor in the second semiconductor layer over the first semiconductor layer and having an emitter coupled to the second terminal. The first well forms a collector of the first transistor and a collector of the second transistor. In one aspect, forming the patterned masking layer is performed such that the patterned masking layer covers the first region of the first semiconductor layer and the plurality of openings expose portions of the second region but not the second region of the first semiconductor layer such that the plurality of heavily doped regions is formed in the second region and not the first region of the first semiconductor layer. In a further aspect, the first transistor is formed over first region of the first semiconductor layer and the second transistor is formed over the second region of the first semiconductor layer which includes the plurality of heavily doped regions. In another aspect of the above another embodiment, wherein the plurality of openings in the patterned masking layer are in a stripe formation over the first semiconductor layer such that the plurality of heavily doped regions are in a stripe formation in a plane parallel to a major surface of the first semiconductor layer. In another aspect, the plurality of openings in the patterned masking layer are in a grid formation over the first semiconductor layer such that the plurality of heavily doped regions form an N×M array in a plane parallel to a major surface of the buried layer, wherein each of N and M are integers greater than or equal to one. In another aspect, the openings in the patterned masking layer are spaced apart by at least 0.5 µm. In another aspect, a dopant concentration of the dopant in the heavily doped regions is in a range of $1\times10^{16}$ cm$^{-3}$ to $1\times10^{19}$ cm$^{-3}$, and a dopant concentration of the dopant in the laterally diffused region is in a range of $1\times10^{15}$ cm$^{-3}$ to $1\times10^{16}$ cm$^{-3}$.

Yet another embodiment relates to a method for forming an electrostatic protection device coupled between a first terminal and a second terminal of an integrated circuit, in which the method includes forming a patterned masking layer over a first region and a second region of a first semiconductor layer. The patterned masking layer covers the first region of the first semiconductor layer and includes a plurality of openings which expose portions of the second region of the first semiconductor layer. The method further includes implanting a dopant of a first conductivity type into the first semiconductor layer using the patterned masking layer, wherein the implanting results in a plurality of highly doped regions in the second region but not the first region of the first semiconductor layer, and wherein, after implanting, dopants extend laterally from the plurality of highly doped region into the first semiconductor layer to form a laterally diffused dopant region surrounding each highly doped region of the plurality of heavily doped regions. The method further includes forming a second semiconductor layer over the first semiconductor layer and the plurality of highly doped regions; forming a first well of the first conductivity type in the second semiconductor layer, extending from a surface of the second semiconductor layer to a heavily doped region of the plurality of heavily doped regions; forming a first transistor in the second semiconductor layer over the first region of the first semiconductor layer and having an emitter coupled to the first terminal; and forming a second transistor in the second semiconductor layer over the second region of the first semiconductor layer and having an emitter coupled to the second terminal. The first well forms a collector of the first transistor and a collector of the second transistor. In one aspect, the plurality of openings in the patterned masking layer are in a stripe formation over the second region of the first semiconductor layer such that the plurality of heavily doped regions are in a stripe formation in a plane parallel to a major surface of the first semiconductor layer. In another aspect, the plurality of openings in the patterned masking layer are in a grid formation over the second region of the first semiconductor layer such that the plurality of heavily doped regions form an N×M array in a plane parallel to a major surface of the buried layer, wherein each of N and M are integers greater than or equal to one. In another aspect, each opening of the plurality of openings in the patterned masking layer is spaced apart from an adjacent opening by at least 0.5 µm. In yet another aspect, a dopant concentration of the dopant in the heavily doped regions is in a range of $1\times10^{16}$ cm$^{-3}$ to $1\times10^{19}$ cm$^{-3}$, and a dopant concentration of the dopant in the laterally diffused region is in a range of $1\times10^{15}$ cm$^{-3}$ to $1\times10^{16}$ cm$^{-3}$.

What is claimed is:

1. An electrostatic protection device coupled between a first terminal and a second terminal of an integrated circuit comprising:
   a semiconductor region;
   a buried layer below the semiconductor region, the buried layer having a plurality of heavily doped regions of a first conductivity type and a laterally diffused region of the first conductivity type between adjacent heavily doped regions of the plurality of heavily doped regions, wherein each heavily doped region extends from a first interface of the semiconductor region and the buried layer to a second interface between the buried layer and a region of the electrostatic protection device below the buried layer in a direction perpendicular to a major surface of the buried layer, wherein heavily doped regions of the plurality of heavily doped regions are surrounded by the laterally diffused region from an upper most portion of the heavily doped regions at the first interface to a lower most portion of the heavily doped region at the second interface in a plane parallel to the major surface of the buried layer, the semiconductor region being a second conductivity type;
   the semiconductor region extends through an opening in the buried layer to the region of the electrostatic protection device below the buried layer, where the buried layer is discontinuous at the opening;
   a first well of the first conductivity type in the semiconductor region, extending from a surface of the semiconductor region to a heavily doped region of the plurality of heavily doped regions of the buried layer;
   a first transistor in the semiconductor region having an emitter coupled to the first terminal; and
   a second transistor in the semiconductor region having an emitter coupled to the second terminal, wherein the first well forms a collector of the first transistor and a collector of the second transistor, and wherein the buried layer is located below at least one of the first transistor and the second transistor.

2. The electrostatic protection device of claim 1, wherein the buried layer is located below only one of the first transistor and the second transistor.

3. The electrostatic protection device of claim 1, wherein the plurality of heavily doped regions are in a stripe formation in a plane parallel to a major surface of the buried layer.

4. The electrostatic protection device of claim 1, wherein the plurality of heavily doped regions form an N×M array in a plane parallel to a major surface of the buried layer, wherein each of N and M are integers greater than or equal to one.

5. The electrostatic protection device of claim 1, wherein the plurality of heavily doped regions and the laterally diffused region form a continuous layer of the first conductivity type, and wherein the semiconductor region is of a second conductivity type different from the first conductivity type.

6. The electrostatic protection device of claim 1, wherein the plurality of heavily doped regions are more heavily doped as compared to the laterally diffused region.

7. The electrostatic protection device of claim 1, further comprising:
   a substrate; and
   an insulating layer over the substrate, wherein the buried layer and the semiconductor region is over the insulating layer, and wherein the semiconductor region extends through the opening in the buried layer to contact the insulating layer.

8. The electrostatic protection device of claim 1, wherein the buried layer is located below only the first transistor and not below the second transistor.

9. A method for forming an electrostatic protection device coupled between a first terminal and a second terminal of an integrated circuit, comprising:
   forming a patterned masking layer over a first region and a second region of a first semiconductor layer, wherein the patterned masking layer comprises a plurality of openings which expose portions of at least one of the first region and the second region of the first semiconductor layer;
   implanting a dopant of a first conductivity type into the first semiconductor layer using the patterned masking layer, wherein the implanting results in a plurality of highly doped regions in the first semiconductor layer, and wherein, after implanting, dopants extend laterally from the plurality of highly doped region into the first semiconductor layer to form a laterally diffused dopant region;
   forming a second semiconductor layer of a second conductivity type over the first semiconductor layer and the plurality of highly doped regions, wherein each highly doped region extends from a first interface of the second semiconductor layer and the first semiconductor layer to a second interface between the first semiconductor layer and a region of the electrostatic protection device below the first semiconductor layer in a direction perpendicular to a major surface of the first semiconductor layer, wherein each highly doped region of the plurality of highly doped regions is surrounded by the laterally diffused region from an upper most portion of the highly doped region at the first interface to a lower most portion of the highly doped region at the second interface in a plane parallel to the major surface of the first semiconductor layer, wherein the highly doped regions and the laterally diffused region form a buried layer in the first semiconductor layer, and the second semiconductor layer extends through an opening in the buried layer to the region of the electrostatic protection device below the first semiconductor layer where the buried layer is discontinuous at the opening;
   forming a first well of the first conductivity type in the second semiconductor layer, extending from a surface of the second semiconductor layer to a heavily doped region of the plurality of heavily doped regions;
   forming a first transistor in the second semiconductor layer over the first semiconductor layer and having an emitter coupled to the first terminal; and
   forming a second transistor in the second semiconductor layer over the first semiconductor layer and having an emitter coupled to the second terminal, wherein the first well forms a collector of the first transistor and a collector of the second transistor.

10. The method of claim 9, wherein forming the patterned masking layer is performed such that the patterned masking layer covers the first region of the first semiconductor layer and the plurality of openings expose portions of the second region but not the second region of the first semiconductor layer such that the plurality of heavily doped regions is formed in the second region and not the first region of the first semiconductor layer.

11. The method of claim 10, wherein the first transistor is formed over first region of the first semiconductor layer and the second transistor is formed over the second region of the first semiconductor layer which includes the plurality of heavily doped regions.

12. The method of claim 9, wherein the plurality of openings in the patterned masking layer are in a stripe formation over the first semiconductor layer such that the plurality of heavily doped regions are in a stripe formation in a plane parallel to a major surface of the first semiconductor layer.

13. The method of claim 9, wherein the plurality of openings in the patterned masking layer are in a grid formation over the first semiconductor layer such that the plurality of heavily doped regions form an N×M array in a plane parallel to a major surface of the buried layer, wherein each of N and M are integers greater than or equal to one.

14. The method of claim 9, wherein the openings in the patterned masking layer are spaced apart by at least 0.5 µm.

15. The method of claim 9, wherein a dopant concentration of the dopant in the heavily doped regions is in a range of $1\times10^{16}$ cm$^{-3}$ to $1\times10^{19}$ cm$^{-3}$, and a dopant concentration of the dopant in the laterally diffused region is in a range of $1\times10^{15}$ cm$^{-3}$ to $1\times10^{16}$ cm$^{-3}$.

16. The method of claim 9, further comprising, prior to forming the patterned masking layer, forming an insulating layer over a substrate and forming the first semiconductor layer over the insulating layer, wherein the second semiconductor layer extends through the opening in the buried layer to contact the insulating layer.

17. A method for forming an electrostatic protection device coupled between a first terminal and a second terminal of an integrated circuit, comprising:
   forming a patterned masking layer over a first region and a second region of a first semiconductor layer, wherein the patterned masking layer covers the first region of the first semiconductor layer and comprises a plurality of openings which expose portions of the second region of the first semiconductor layer;
   implanting a dopant of a first conductivity type into the first semiconductor layer using the patterned masking layer, wherein the implanting results in a plurality of highly doped regions in the second region but not the first region of the first semiconductor layer, and wherein, after implanting, dopants extend laterally from the plurality of highly doped region into the first semiconductor layer to form a laterally diffused dopant region surrounding each highly doped region of the plurality of heavily doped regions;
   forming a second semiconductor layer of a second conductivity type over the first semiconductor layer and the plurality of highly doped regions, wherein each highly doped region extends from a first interface of the second semiconductor layer and the first semiconductor layer to a second interface between the first semiconductor layer and a region of the electrostatic protection device below the first semiconductor layer in a direction perpendicular to a major surface of the first semiconductor layer, wherein each highly doped region of the plurality of highly doped regions is surrounded by the laterally diffused region from an upper most portion of the highly doped region at the first interface to a lower most portion of the highly doped region at the second interface in a plane parallel to the major surface of the first semiconductor layer, wherein the highly doped regions and the laterally diffused region form a buried layer in the first semiconductor layer, and the second semiconductor layer extends through an opening in the buried layer to the region of the electrostatic protection device below the first semiconductor layer where the buried layer is discontinuous at the opening;

forming a first well of the first conductivity type in the second semiconductor layer, extending from a surface of the second semiconductor layer to a heavily doped region of the plurality of heavily doped regions;

forming a first transistor in the second semiconductor layer over the first region of the first semiconductor layer and having an emitter coupled to the first terminal; and forming a second transistor in the second semiconductor layer over the second region of the first semiconductor layer and having an emitter coupled to the second terminal, wherein the first well forms a collector of the first transistor and a collector of the second transistor.

18. The method of claim 17, wherein the plurality of openings in the patterned masking layer are in a stripe formation over the second region of the first semiconductor layer such that the plurality of heavily doped regions are in a stripe formation in a plane parallel to a major surface of the first semiconductor layer.

19. The method of claim 17, wherein the plurality of openings in the patterned masking layer are in a grid formation over the second region of the first semiconductor layer such that the plurality of heavily doped regions form an N×M array in a plane parallel to a major surface of the buried layer, wherein each of N and M are integers greater than or equal to one.

20. The method of claim 17, wherein a dopant concentration of the dopant in the heavily doped regions is in a range of $1 \times 10^{16}$ cm$^{-3}$ to $1 \times 10^{19}$ cm$^{-3}$, and a dopant concentration of the dopant in the laterally diffused region is in a range of $1 \times 10^{15}$ cm$^{-3}$ to $1 \times 10^{16}$ cm$^{-3}$.

* * * * *